United States Patent
Stiff et al.

(10) Patent No.: US 7,170,319 B1
(45) Date of Patent: Jan. 30, 2007

(54) METHOD AND AN APPARATUS TO REDUCE DUTY CYCLE DISTORTION

(75) Inventors: Jonathon C. Stiff, Beaverton, OR (US); King H. Kwan, Bellevue, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 85 days.

(21) Appl. No.: 10/962,929

(22) Filed: Oct. 11, 2004

(51) Int. Cl.
*H03K 19/094* (2006.01)
*H03K 19/0175* (2006.01)
*H03K 19/096* (2006.01)
*H03L 7/00* (2006.01)

(52) U.S. Cl. .................... 326/86; 326/83; 327/156
(58) Field of Classification Search ........... 326/82–86, 326/95–127; 327/141–156
See application file for complete search history.

(56) References Cited

U.S. PATENT DOCUMENTS

| | | | |
|---|---|---|---|
| 6,411,145 B1 * | 6/2002 | Kueng et al. ............... 327/175 |
| 6,466,078 B1 | 10/2002 | Stiff | |
| 6,798,297 B1 | 9/2004 | Kwan et al. | |
| 6,836,185 B1 * | 12/2004 | Pobanz .................. 330/260 |
| 6,967,514 B2 * | 11/2005 | Kizer et al. ............. 327/175 |

* cited by examiner

*Primary Examiner*—Rexford Barnie
*Assistant Examiner*—Jason Crawford
(74) *Attorney, Agent, or Firm*—Blakely, Sokoloff, Taylor & Zafman LLP

(57) ABSTRACT

A method and an apparatus to reduce duty cycle distortion are described. The apparatus may include a first current-mode logic (CML) circuit block comprising a positive input and a negative input and a second CML circuit block coupled in series to the first CML circuit block. The second CML circuit block may comprise a positive output, a negative output and a first transistor coupled between the positive input and the positive output. The second transistor may be coupled between the negative input and the negative output of the second CML circuit block.

17 Claims, 6 Drawing Sheets

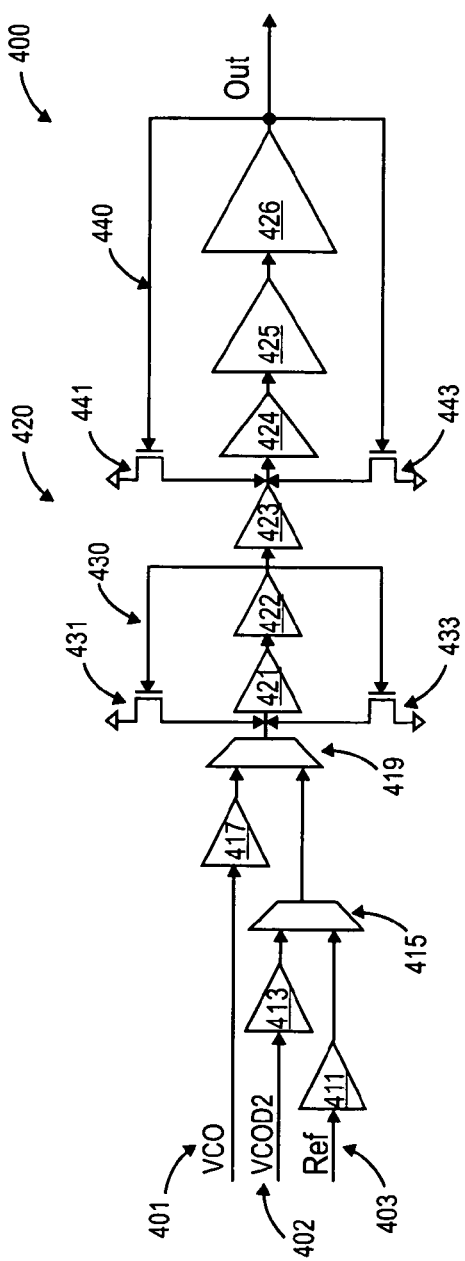
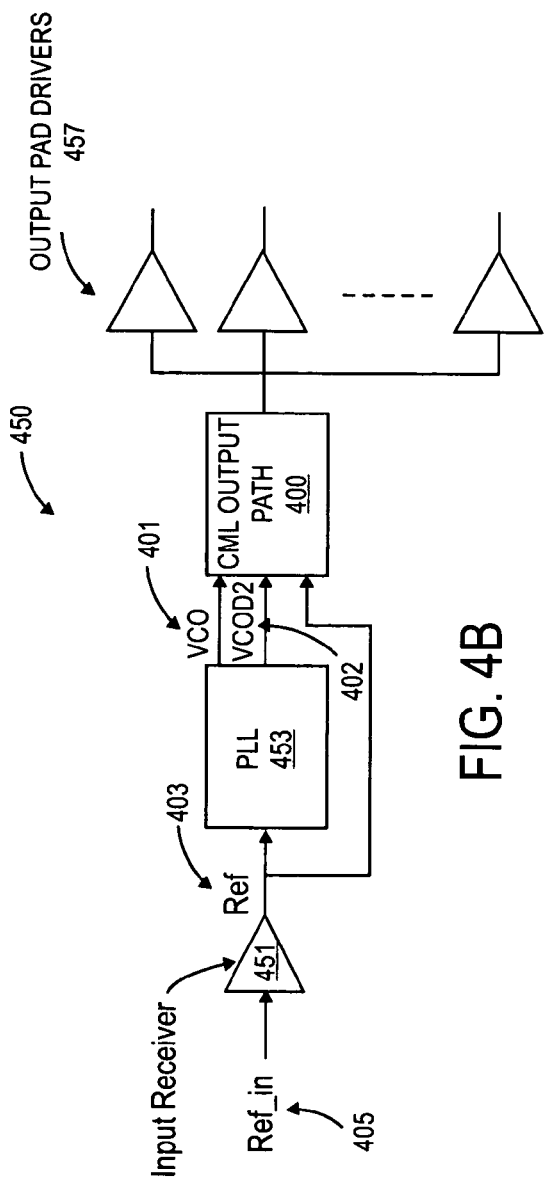
FIG. 4A
FIG. 4B

METHOD AND AN APPARATUS TO REDUCE DUTY CYCLE DISTORTION

FIELD OF INVENTION

The present invention relates generally to integrated circuits (IC), and more particularly, to reducing duty cycle distortion in current-mode logic (CML) circuits.

BACKGROUND

Current mode logic (CML) circuit blocks are commonly used in semiconductor integrated circuit designs because of the various advantages of CML circuit blocks. However, conventional CML circuit blocks generally lack a mechanism to restrain the output differential signal Direct Current (DC) levels when running close to the edge of the bandwidth of the CML circuit blocks. With slightly non-ideal inputs (such as a delay offset) or mismatched devices in the CML circuit blocks, the positive and negative output DC levels may drift away from each other, causing significant output duty cycle distortion. The output duty cycle distortion is especially serious through a series of CML buffers through which the effect accumulates.

FIG. 1 shows a conventional Vss-referenced (also referred to as ground-referenced) complementary metal oxide semiconductor (CMOS) CML buffer with active loads. The CML buffer 100 is a differential-input differential-output logic circuit that provides high-speed operation and good power supply noise rejection (PSNR). The CML buffer 100 includes a current source 110 to deliver a substantially fixed current I, which may be wholly or partly steered to one of the two active loads 121 and 122 via the differential pair of Metal Oxide Semiconductor Field Effect Transistors (MOSFET) 131 and 132. The differential nature of the CML buffer 100 and the substantially fixed supply current I make the CML buffer 100 more resistant to power supply noise. Furthermore, the reduced output voltage swing may allow the CML buffer 100 to operate at a higher frequency than other types of conventional CMOS logic circuits.

However, the output cycle distortion of the CML buffer 100 may limit the operation frequency of the CML buffer 100. One reason the output cycle distortion occurs is that the CML buffer 100 CMOS devices run out of bandwidth at high frequencies, making the CML buffer 100 unable to generate a full-swing CML output. Since the output load cannot be fully charged or discharged to the intended swing limited voltage levels within the signal period, mismatches in the input signal and the circuit components generate DC level mismatch on the CML buffer 100 differential outputs. This problem worsens as the differential signals propagate through a series of CML buffers.

In one conventional CML path, which includes a six-stage CML buffer chain and multiple multiplexers, the output experienced large duty cycle distortion at high frequencies (e.g., approximately 800 MHz or above). FIG. 2 shows the waveforms generated from the conventional CML path simulation. The conventional CML path was simulated in a slow corner with slightly non-ideal differential inputs having a duty cycle of about 49%. The differential input waveforms 210 are shown in the upper half of FIG. 2. The differential output waveforms 220 of the CML path reveal a duty cycle of about 45.5%, which corresponds to about 3.5% duty cycle distortion, with considerable DC mismatch between the outputs. The duty cycle distortion further increases when random device mismatches, such as CMOS device threshold voltage (Vt) mismatch, are introduced.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

FIG. 4A shows one embodiment of a CML output path.

FIG. 4B shows one embodiment of a clock generator.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

Figure 3:
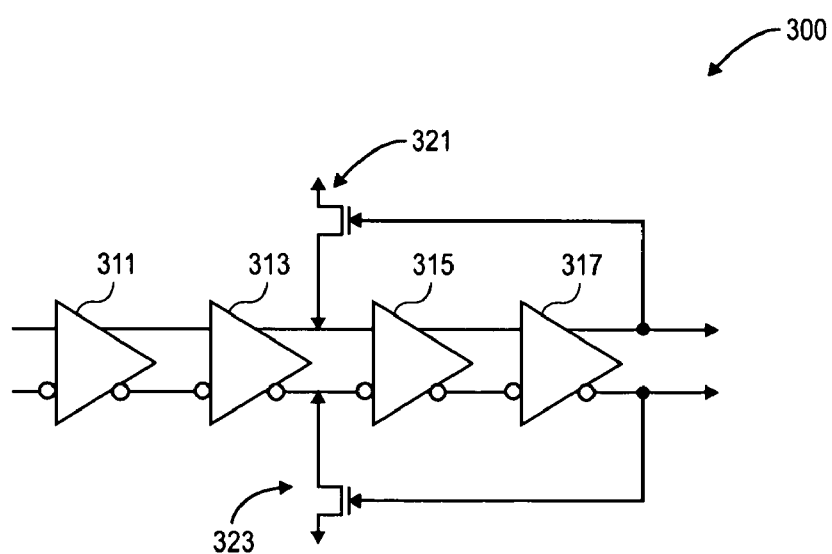
FIG. 3 shows one embodiment of a duty cycle reduction circuit.

FIG. 3 shows one embodiment of a duty cycle reduction circuit. The duty cycle reduction circuit 300 includes four current-mode logic (CML) buffers 311–317 and two transistors 321 and 323. Each of the CML buffers 311–317 includes a positive output, a negative output, a positive input, and a negative input. The CML buffers 311–317 are coupled to each other serially such that the positive output of one CML buffer is coupled to the positive input of the next CML buffer and the negative output of one CML buffer is coupled to the negative input of the next CML buffer. In one embodiment, each of the CML buffers 311–317 is substantially the same as the CML buffer 100 shown in FIG. 1.

In one embodiment, the transistor 321 is coupled between two CML buffers 315 and 317. A gate of the transistor 321 is coupled to the positive output of the CML buffer 317 and a drain of the transistor 321 is coupled to the positive input of the CML buffer 315. A source of the transistor 321 is grounded. Likewise, the transistor 323 is coupled between the CML buffers 315 and 317. The gate of the transistor 323 is coupled to the negative output of the CML buffer 317 and a drain of the transistor 323 is coupled to the negative input of the CML buffer 315. The source of the transistor 323 is grounded. Since the circuit 300 is a Vss-referenced design, the transistors 321 and 323 are n-type Metal Oxide Semi conductor (nMOS) transistors and the sources of the transistors 321 and 323 are grounded. In an alternative embodiment, the circuit 300 is a Vdd-referenced design, and thus, p-type Metal Oxide Semiconductor (pMOS) transistors are used instead. Furthermore, the sources of the pMOS transistors are coupled to a positive voltage supply.

Referring back to FIG. 3, the transistors 321 and 323 provide negative feedbacks from the CML buffer 317 to the CML buffer 315. In one embodiment, the transistors 321 and 323 serve as DC level comparators between the inputs of the CML buffer 315 and the outputs of the CML buffer 317. The average voltage driving each of the transistors 321 and 323 is substantially proportional to the DC level of the corresponding output of the CML buffer 317. The difference of the driving voltages may cause one of the transistors 321 and 323 to pull more strongly than the other transistor on the corresponding input of the CML buffer 315. By pulling more strongly on one of the inputs of the CML buffer 315, the DC levels of the outputs of the CML buffer 317 are caused to move closer to the load power supply. Therefore, the DC level mismatch between the outputs of the CML buffer 317 may be reduced. Consequently, the duty cycle distortion at the outputs of the CML buffer 317 is also reduced.

Although the technique illustrated in FIG. 3 is applied to two CML buffers 315 and 317, it should be apparent that this technique may be applied to different numbers of CML buffers, such as 3, 4, 5, etc. Furthermore, additional pairs of transistors may be coupled between other CML buffers in the series of CML buffers 311–317 to further reduce duty cycle distortion along the series of CML buffers 311–317. Note that the CML buffers 311–317 are described above as examples to illustrate the technique. This technique may be applied to other types of CML circuit blocks (e.g., CML multiplexers) and/or other combinations of CML circuit blocks in different embodiments.

FIG. 4A illustrates one embodiment of a CML output path. The CML output path 400 includes three input buffers 411, 413, and 417, two multiplexers (MUX) 415 and 419, and a six-stage CML buffer chain 420. The input buffers 411, 413, and 417 receive the signals, Ref 403, VCOD2 402, and VCO 401, respectively. The outputs of the input buffers 411 and 413 are coupled to the inputs of the MUX 415. The output of the MUX 415 and the output of the input buffer 417 are coupled to the inputs of the MUX 419. The output of the MUX 419 is input to the six-stage CML buffer chain 420.

In one embodiment, the six-stage CML buffer chain 420 includes six CML buffers 421–426 and two feedback loops 430 and 440. The six CML buffers 421–426 are coupled to each other serially. The positive output of each of the CML buffers 421–426 is coupled to the positive input of the next CML buffer in the CML buffer chain 420. Likewise, the negative output of each of the CML buffers 421–426 is coupled to the negative input of the next CML buffer in the CML buffer chain 420. Note that for the purpose of simplifying the illustration, the positive and negative inputs of each of the CML buffers 421–426 are merged into a single arrow in FIG. 4A. Likewise, the positive and negative outputs of each of the CML buffers 421–426 are also merged into a single arrow.

Figure 1:
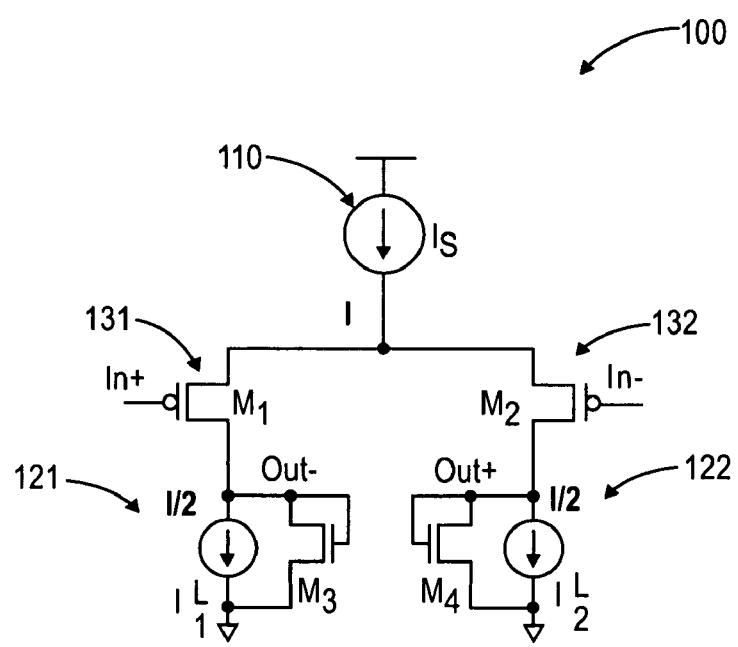
FIG. 1 shows a conventional complementary metal oxide semiconductor (CMOS) current-mode logic (CML) buffer.
Figure 2:
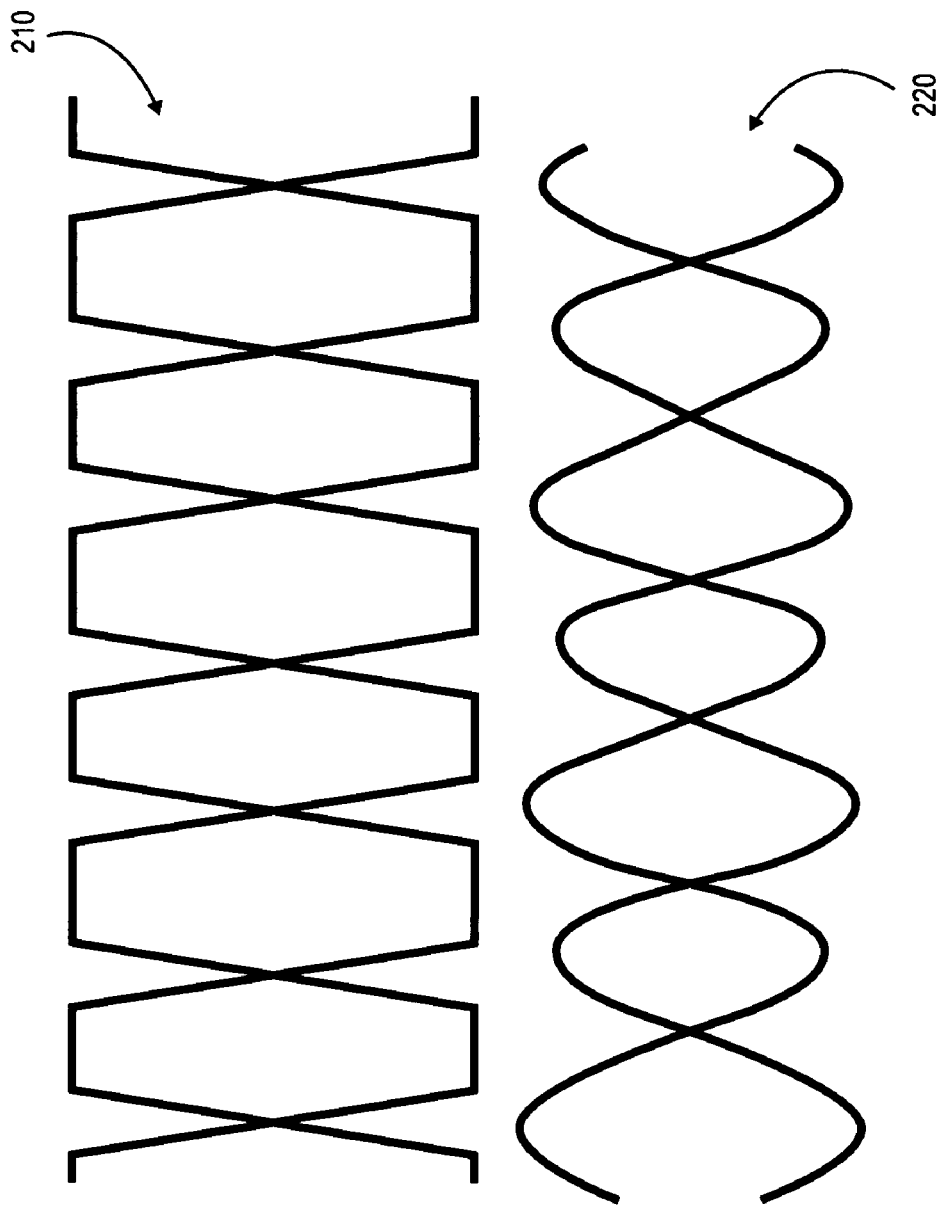
FIG. 2 shows the input and output waveforms of a conventional CML path.

In one embodiment, each of the CML buffers 421–426 is substantially the same as the CML buffer 100 shown in FIG. 1. However, the sizes of the devices within each of the CML buffers 421–426 may or may not be the same for each of the CML buffers 421–426. Hence, the overall size of each of the CML buffers 421–426 may or may not be the same. In one embodiment, the size of each of the CML buffers 421–426 is bigger than the previous CML buffer in the CML buffer chain 420 such that the output signal passing through the CML buffer chain 420 may be amplified or applied to drive larger capacitive loads.

In one embodiment, the feedback loop 430 is applied to the two buffer stages formed by the CML buffers 421–422. The feedback loop 430 includes two transistors 431 and 433. The transistor 431 is coupled between the positive output of the CML buffer 422 and the positive input of the CML buffer 421. The gate of the transistor 431 is driven by the positive output of the CML buffer 422 and the drain of the transistor 431 is coupled to the positive input of the CML buffer 421. The source of the transistor 431 is grounded. Likewise, the transistor 433 is coupled between the negative output of the CML buffer 422 and the negative input of the CML buffer 421. The gate of the transistor 433 is driven by the negative output of the CML buffer 422 and the drain of the transistor 433 is coupled to the negative input of the CML buffer 421. The source of the transistor 433 is grounded. Both transistors 431 and 433 provide negative feedbacks from the outputs of the CML buffer 422 to the inputs of the CML buffer 421.

In one embodiment, the six-stage CML buffer chain 420 further includes a second feedback loop 440. The feedback loop 440 is applied to the three buffer stages formed by the CML buffers 424–426. The feedback loop 440 includes two transistors 441 and 443. The transistor 441 is coupled between the positive output of the CML buffer 426 and the positive input of the CML buffer 424. The gate of the transistor 441 is driven by the positive output of the CML buffer 426 and the drain of the transistor 441 is coupled to the positive input of the CML buffer 424. The source of the transistor 441 is grounded. Likewise, the transistor 443 is coupled between the negative output of the CML buffer 426 and the negative input of the CML buffer 424. The gate of the transistor 443 is driven by the negative output of the CML buffer 426 and the drain of the transistor 443 is coupled to the negative input of the CML buffer 424. The source of the transistor 443 is grounded. Both transistors 441 and 443 provide negative feedbacks from the outputs of the CML buffer 426 to the inputs of the CML buffer 424.

Alternatively, a feedback loop may be applied to a different number of buffer stages formed by different combinations of the CML buffers 421–426. For instance, a first, a second, and a third feedback loops may be applied to the two-buffer stages formed by the CML buffers 421–422, 423–424, and 425–426, respectively. Furthermore, referring to FIG. 4A, the transistors 431, 433, 441, and 443 in the feedback loops 430 and 440, respectively, are NMOS transistors because the CML output path 400 is Vss-referenced. In an alternative embodiment, pMOS transistors are used in the feedback loops 430 and 440 if the CML output path 400 is Vdd-referenced.

Each of the feedback loops 430 and 440 provides a pair of negative feedback signals from one CML buffer to a prior CML buffer along the CML buffer chain 420 to reduce duty cycle distortion in the positive output and the negative output of the one CML buffer. Details of the operation of some embodiments of the feedback loops 430 and 440 have been discussed above with reference to FIG. 3. Furthermore, the CML output path 400 may be incorporated into a clock generator in some integrated circuit designs. One example of the clock generator is shown in FIG. 4B.

FIG. 4B illustrates one embodiment of a clock generator. The clock generator 450 includes an input receiver 451, a phase-locked loop (PLL) 453, a CML output path 400, and a number of output pad drivers 457. Details of some embodiments of the CML output path 400 have been discussed above with reference to FIG. 4A. Note that other embodiments of the clock generator 450 may include more or fewer components than those shown in FIG. 4B.

In one embodiment, the input receiver 451 receives a reference signal input, Ref_in 405. The output of the input receiver 451, Ref 403, is coupled to the input of the PLL 453 and one of the inputs of the CML output path 400. The outputs of the PLL 453, VCO 401 and VCOD2 402, are also input to the CML output path 400. An output of the CML output path 400 is input to each of the output pad drivers 457. The output pad drivers 457 drive the output clock signals onto a set of output pads.

Figure 5:
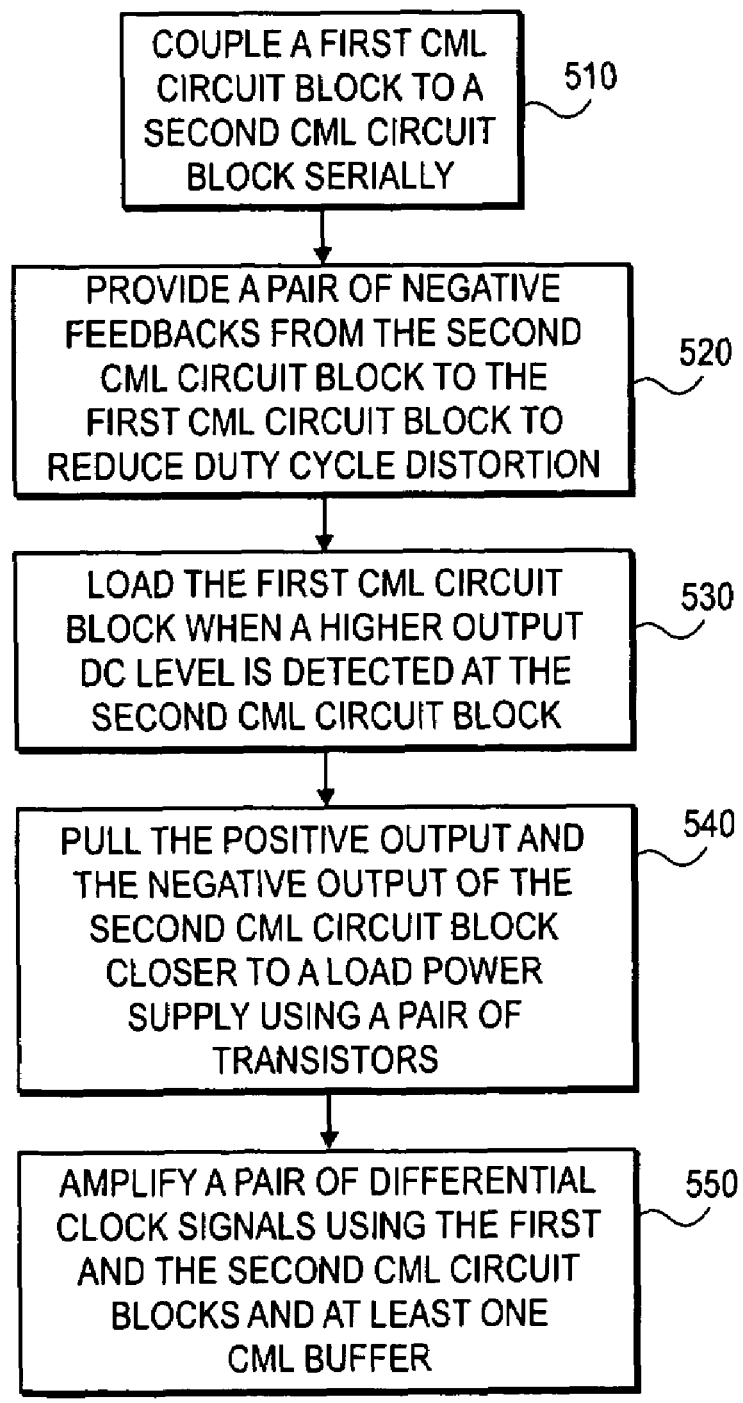
FIG. 5 shows one embodiment of a process to reduce duty cycle reduction.

FIG. 5 shows one embodiment of a process to reduce duty cycle distortion in CML circuit blocks. The process is performed by processing logic that may comprise hardware (e.g., circuitry, dedicated logic, etc.), software (such as is run on a general-purpose computer system, a server, or a dedicated machine), or a combination of both.

In one embodiment, a first CML circuit block (e.g., a CML buffer, a CML multiplexer, etc.) is coupled to a second CML circuit block serially (processing block 510). The first CML circuit block may receive a pair of positive and negative input signals (e.g., a pair of differential clock signals) and output a pair of positive and negative output signals. The second CML circuit block may in turn receive the pair of positive and negative output signals from the first CML circuit block. In response to the pair of output signals from the first CML circuit block, the second CML circuit block may generate another pair of positive and negative output signals. However, the duty cycle of the pair of output signals from the second CML circuit block may be distorted from the duty cycle of the pair of input signals to the first CML circuit block. Thus, a pair of negative feedbacks from the second CML circuit block may be provided to the first CML circuit block to reduce duty cycle distortion in the pair of output signals from the second CML circuit block (processing block 520).

In one embodiment, the first CML circuit block is loaded when a higher output DC level is detected at the second CML circuit block (processing block 530). Then the positive output and the negative output of the second CML circuit block are pulled closer to a load power supply using a pair of transistors (processing block 540). If the first and the second CML circuit blocks are Vss-referenced, then a pair of nMOS transistors may be used. Alternatively, if the first and the second CML circuit blocks are Vdd-referenced, then a pair of pMOS transistors may be used. In some embodiments, the pair of input signals to the first CML circuit block are amplified using the first CML circuit block, the second CML circuit block, and at least one CML buffer in between the first and the second CML circuit blocks (processing block 550).

Figure 6:
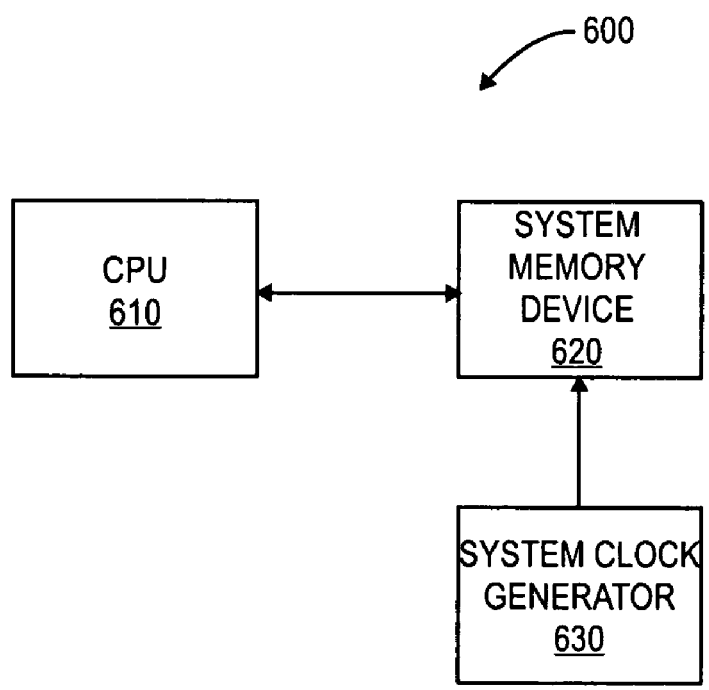
FIG. 6 shows an exemplary embodiment of a computing system usable with one embodiment of the invention.

FIG. 6 illustrates an exemplary embodiment of a computing system 600 usable with one embodiment of the invention. The system 600 includes a central processing unit (CPU) 610, a system memory device 620, and a system clock generator 630. The memory device 620 may include various types of memories, such as, for example, dynamic random access memory (DRAM), synchronous DRAM (SDRAM), Rambus® DRAM (RDRAM), or flash memory, etc. The CPU 610 is coupled to the system memory device 620 to store or to retrieve instructions and/or data from the system memory device 620. The system memory device 620 is coupled to the system clock generator 630. The system clock generator 630 may provide a pair of differential system clock signals to the system memory device 620. The system memory device 620 may run on the pair of differential system clock signals. Details of one embodiment of the system clock generator 630 have been discussed above with reference to FIG. 4B. The system clock generator 630 may include at least two CML circuit blocks and two transistors coupled between the two CML circuit blocks. The two transistors provide feedbacks to the first CML circuit block from the second CML circuit block to reduce duty cycle distortion in the outputs of the second CML circuit block. Details of the reduction of duty cycle distortion have been discussed above.

Note that any or all of the components of the computing system 600 and associated hardware may be used in various embodiments of the present invention. However, it can be appreciated that other configurations of the computing system 600 may include additional or fewer components than those illustrated in FIG. 6.

Although the computing system 600 is described above to illustrate one application of the technology disclosed, one should appreciate that the technology disclosed is also applicable to other types of electronic systems having CML circuit blocks to reduce duty cycle distortion in the outputs from the CML circuit blocks.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
   a first current-mode logic (CML) circuit block comprising a positive input and a negative input;
   a second CML circuit block coupled to the first CML circuit block in series, the second CML circuit block comprising a positive output and a negative output;
   a first transistor coupled between the positive input and the positive output, wherein a gate of the first transistor is directly coupled to the positive output; and
   a second transistor coupled between the negative input and the negative output, wherein a gate of the second transistor is directly coupled to the negative output.

2. The apparatus of claim 1, further comprising:
   at least one CML buffer coupled in between the first and the second CML circuit blocks.

3. The apparatus of claim 2, wherein the first CML circuit block comprises a first CML buffer and the second CML circuit block comprises a second CML buffer.

4. The apparatus of claim 1, wherein the first transistor comprises a first n-type Metal Oxide Semiconductor (MOS) transistor coupled to a negative voltage supply and the second transistor comprises a second n-type MOS transistor coupled to the negative voltage supply.

5. The apparatus of claim 1, wherein the first transistor comprises a first p-type Metal Oxide Semiconductor (MOS) transistor coupled to a positive voltage supply and the second transistor comprises a second p-type MOS transistor coupled to the positive voltage supply.

6. The apparatus of claim 1, further comprising:
   a clock generator comprising
      a phase locked loop; and
      an output path coupled to the phase locked loop, wherein the output path comprises the first CML circuit block, the second CML circuit block, the first transistor, and the second transistor.

7. The apparatus of claim 6, further comprising:
a memory device coupled to the clock generator to receive a pair of differential clock signals from the output path of the clock generator; and
a central processing unit coupled to the memory device.

8. A method, comprising:
coupling a first current-mode logic (CML) circuit block to a second CML circuit block in series; and
providing a pair of negative feedbacks from the second CML circuit block to the first CML circuit block via a first and a second transistors to reduce duty cycle distortion in a positive output and a negative output of the second CML circuit block, wherein providing a pair of negative feedbacks comprises:
  driving the gate of the first transistor and the gate of the second transistor directly using the positive and the negative outputs of the second CML circuit block, respectively, to send a first and a second feedback signals to the first CML circuit block.

9. The method of claim 8, further comprising:
loading the first CML circuit block in response to a direct current (DC) level mismatch between the positive output and the negative output of the second CML circuit block.

10. The method of claim 9, further comprising:
pulling the positive output and the negative output of the second CML circuit block closer to a load power supply using the pair of transistors.

11. The method of claim 10, wherein the load power supply is negative and the pair of transistors comprises a pair of n-type Metal Oxide Semiconductor (MOS) transistors.

12. The method of claim 10, wherein the load power supply is positive and the pair of transistors comprises a pair of p-type Metal Oxide Semiconductor (MOS) transistors.

13. The method of claim 8, further comprising:
amplifying a pair of differential clock signals using the first and the second CML circuit blocks and at least one CML buffer, wherein the at least one CML buffer is coupled between the first and the second CML circuit blocks.

14. An apparatus, comprising:
a first current-mode logic (CML) circuit block;
a second CML circuit block coupled to the first CML circuit block; and
means for reducing duty cycle distortion in a current-mode logic (CML) path comprising the first CML circuit block and the second CML circuit block, wherein said means for reducing duty cycle distortion comprises a first transistor having a gate directly coupled to a positive output of the second CML circuit block and a second transistor having a gate directly coupled to a negative output of the second CML circuit block.

15. The apparatus of claim 14, wherein the means for reducing duty cycle distortion comprises:
means for sending a pair of negative feedbacks from the second CML circuit block to the first CML circuit block.

16. The apparatus of claim 14, further comprising:
means for reducing a direct current (DC) level mismatch between a positive output and a negative output of the second CML circuit block.

17. The apparatus of claim 16, wherein the means for reducing the DC level mismatch comprises:
means for pulling the positive output and the negative output of the second CML circuit block closer to a load power supply.

* * * * *